(12) United States Patent
Arita et al.

(10) Patent No.: US 6,306,667 B1
(45) Date of Patent: Oct. 23, 2001

(54) METHOD FOR FORMING A CAPACITOR IN A SEMICONDUCTOR DEVICE

(75) Inventors: Koji Arita; Yoshitake Kato, both of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/577,993

(22) Filed: May 25, 2000

(30) Foreign Application Priority Data

May 25, 1999 (JP) .................................................. 11-144996

(51) Int. Cl.[7] ....................... H01L 21/00; H01L 21/8242; H01L 21/20
(52) U.S. Cl. ................................. 438/3; 438/240; 438/396
(58) Field of Search .............................. 438/240, 3, 253, 438/396, 387, 686

(56) References Cited

U.S. PATENT DOCUMENTS

| 6,001,660 | * | 12/1999 | Park et al. ................................. 438/3 |
| 6,127,218 | * | 10/2000 | Kang ..................................... 438/240 |
| 6,143,598 | * | 11/2000 | Martin et al. ........................ 438/240 |
| 6,150,689 | * | 11/2000 | Narui et al. ........................... 257/306 |

* cited by examiner

Primary Examiner—Charles Bowers
Assistant Examiner—Brook Kebede
(74) Attorney, Agent, or Firm—McGinn & Gibb, PLLC

(57) ABSTRACT

In a method for forming a capacitor in the semiconductor memory, a lower electrode is formed on an interlayer insulator film, and a high dielectric constant insulating film is formed to cover the whole surface including the lower electrode. Furthermore, an upper electrode layer is formed to cover the high dielectric constant insulating film. Thereafter, a plasma treatment is carried out to expose a surface of the upper electrode layer to plasma so that a suctorial layer is uniformly formed at the whole surface of the upper electrode layer, and then, a NSG film is grown on the whole surface of the upper electrode layer by a CVD process using TEOS as a starting material. Thus, an interlayer insulator film of the NSG film can be formed to have a uniform film thickness over the whole surface of the upper electrode.

16 Claims, 2 Drawing Sheets

METHOD FOR FORMING A CAPACITOR IN A SEMICONDUCTOR DEVICE

BACKGROUND OF THE INVENTION

The present invention relates to a method for fabricating a semiconductor memory exemplified by a DRAM (dynamic random access memory), and more specifically to a method for forming a capacitor in the semiconductor memory.

With an increased integration density of the semiconductor memory exemplified by a DRAM, it is actively researched to form a capacitor insulating film of a high dielectric constant insulating material typified by (Ba, Sr)TiO$_3$, in place of a silicon oxide and a silicon nitride.

Referring to FIGS. 1A to 1C, there are shown diagrammatic sectional views for illustrating a process for forming a capacitor having a high dielectric constant insulating film in a semiconductor memory.

FIG. 1A shows a condition that a lower electrode 103 is formed on an interlayer insulator film 102 at a position of a capacitor contact 101 formed to penetrate through the interlayer insulator film 102. This lower electrode 103 can he formed by depositing a multilayer metal film formed of Ti, TiN and Ru on the interlayer insulator film 102 by a sputtering, and by patterning the multilayer metal film into a desired shape by a dry etching using a patterned photoresist mask.

As shown in FIG. 1B, a high dielectric constant insulating film 104 of (Ba, Sr)TiO$_3$ is formed to cover the whole surface by a MO-CVD (metal organic chemical vapor deposition) process, and an upper electrode 105 of Ru (ruthenium) is formed on the high dielectric constant insulating film 104 by a sputtering.

Thereafter, as shown in FIG. 1C, an interlayer insulator film 106 is formed to cover the whole surface by a CVD process, so that an interconnection will he formed on the interlayer insulator film 106.

In the above mentioned example, if the interlayer insulator film 106 is formed of a NSG (non-doped silicate glass) film which is formed by a CVD process using TEOS (tetraethoxysilane) as a starting material, the interlayer insulator film 106 becomes uneven over the whole surface, as shown in FIG. 1C. The cause for this is considered that the NSG film formed by the CVD process using the TEOS as the starting material is apt to be influenced by crystallinity and hydration of an underlying layer, with the result that if the crystallinity and the hydration of the underlying layer is not satisfactory, it is difficult to form an uniform NSG film. In addition, in a stepped structure created by the patterned lower electrode 103 as shown in FIG. 1B, it is difficult to control a crystallographic axis at an upper surface and at a side surface of the electrode (because an orientation axis of a deposited film becomes perpendicular to the substrate and therefore the crystallographic axis at the upper surface of the electrode becomes perpendicular to the crystallographic axis at the side surface of the electrode), with the result that the grown NSG film has an irregular film thickness over the whole surface.

BRIEF SUMMARY OF THE INVENTION

Accordingly, it is an object of the present invention to provide a method for fabricating a semiconductor memory, which has overcome the above mentioned problems of the prior art.

Another object of the present invention is to provide a method for forming in the semiconductor memory a capacitor covered with an interlayer insulator film formed of an NSG film which is formed by a CVD process using the TEOS and which has an uniform thickness.

The above and other objects of the present invention are achieved in accordance with the present invention by a method for forming a capacitor in the semiconductor memory, the method comprising the steps of forming a lower electrode having a desired pattern on an insulating film, forming a high dielectric constant insulating film to cover the whole surface including the lower electrode, forming an upper electrode layer to cover the high dielectric constant insulating film, performing a plasma treatment to expose a surface of the upper electrode layer to plasma, and depositing a non-doped silicate glass (NSG) film to cover the upper electrode layer by a CVD process using tetraethoxysilane (TEOS) as a starting material.

For example, the plasma treatment is carried out by exposing a surface of the upper electrode layer to plasma of an O$_2$ gas to a mixed gas of Ar/Cl$_2$ (90%/10% in volume)

With the above mentioned arrangement, since the surface of the upper electrode layer is treated with plasma, the surface of the upper electrode layer is subjected to damage at some degree, so that homology the surface has a some degree of roughness. In other words, nucleuses (or defects) from which a crystal grows, are uniformly generated over the whole surface by the plasma treatment. Thus, a suctorial layer is uniformly formed at the whole surface of the upper electrode layer, so that the NSG film formed by a CVD process using the TEOS as a starting material can be grown to have a uniform film thickness.

As mentioned hereinbefore, in the stepped structure created by the patterned lower electrode, it was difficult to control a crystallographic axis at an upper surface and at a side surface of the electrode, with the result that the grown NSG becomes greatly irregular in film thickness over the whole surface. In the present invention, however, since the suctorial layer is uniformly formed at the whole surface of the upper electrode layer by treating the surface of the upper electrode layer with plasma, the NSG film formed by a CVD process using the TEOS as a starting material can be grown to have a uniform film thickness.

In addition, even in a structure patterned to be difficult to control a crystallographic axis, since nucleuses are uniformly generated over the whole surface by the plasma treatment, an uniform film can be formed.

On the other hand, when the NSG film is formed to cover the upper electrode layer by the CVD process using the TEOS as the starting material without treating the surface of the upper electrode layer by plasma, it was difficult to form an uniform NSG film because the NSG film formed by the CVD process using the TEOS as the starting material is easily influenced by crystallinity aid hydration of an underlying layer.

The above and other objects, features and advantages of the present invention will be apparent from the following description of preferred embodiments of the invention with reference to the accompanying drawings.

BRIEF DESCRIPTION OF THE DRAWINGS

FIGS. 2A and 2B are diagrammatic sectional views for illustrating a featured steps in the process in accordance with

DETAILED DESCRIPTION OF THE INVENTION

Figure 1A:
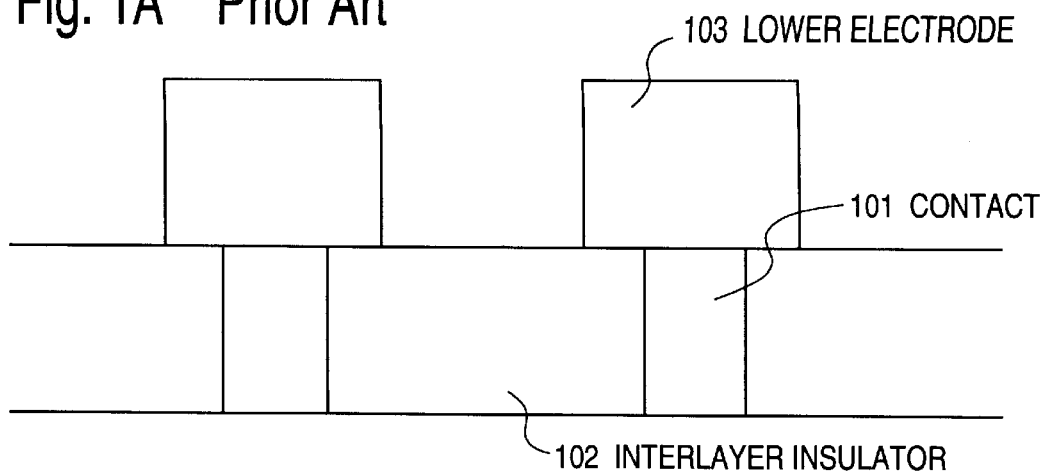
FIGS. 1A to 1C are diagrammatic sectional views for illustrating a prior art process for forming a capacitor having a high dielectric constant insulating film in the semiconductor memory.

Now, embodiments of the process in accordance with the present invention for forming a capacitor having a high dielectric constant insulating film in the semiconductor memory will be described with reference to the accompanying drawings.

First Embodiment

First, similarly to the prior art process explained with reference to FIG. 1A, a lower electrode 103 is formed on an interlayer insulator film 102 at a position of a capacitor contact 101 formed to penetrate through the interlayer insulator film 102. Here, as well known to persons skilled in the art, the interlayer insulator film 102 is formed to cover, for example, a semiconductor substrate (not shown) where a number of transistors (also not shown) are formed each of which is to be connected to a capacitor for constitute one DRAM memory cell. The capacitor contact 101 is connected to one of a pair of source/drain regions (not shown) of the corresponding transistor.

For example, the lower electrode 103 can be formed by depositing a multilayer metal film formed of Ti, TiN and Ru on the interlayer insulator film 102 by a sputtering, and by patterning the multilayer metal film into a desired shape by a dry etching using a patterned photoresist mask.

Then, similarly to the prior art process explained with reference to FIG. 1B, a high dielectric constant insulating film 104 of (Ba, Sr)TiO$_3$ is formed to cover the whole surface by the MO-CVD process, and an upper electrode 105 of Ru (ruthenium) is formed by on the high dielectric constant insulating film 104 by a sputtering.

Figure 2A:
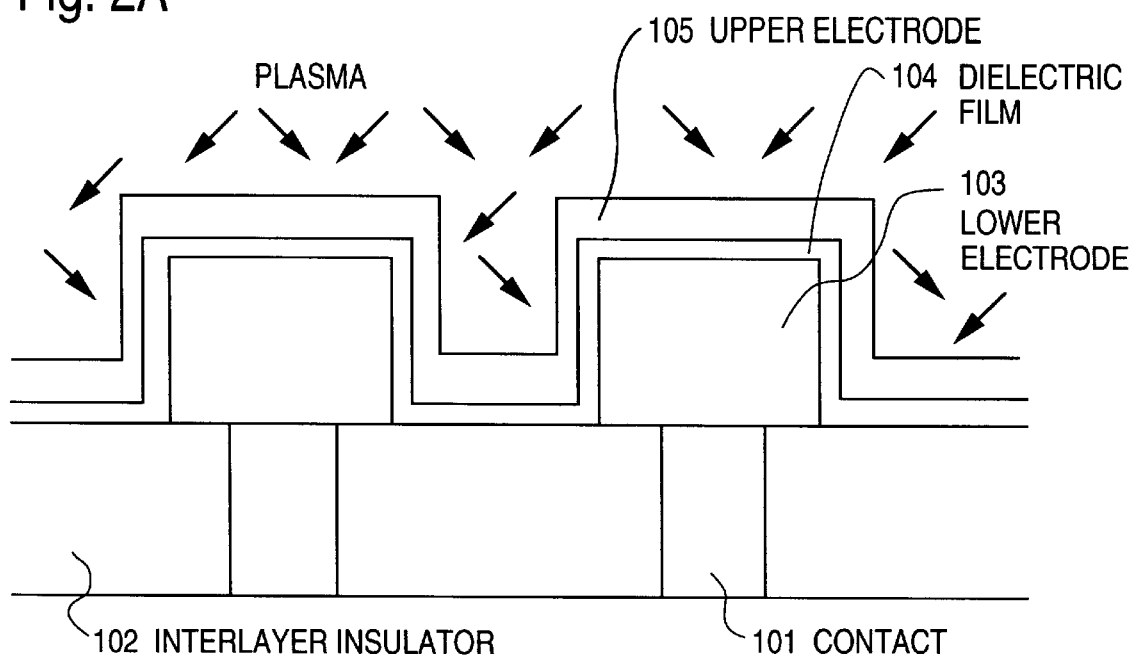

Thereafter, in accordance with the present invention, as shown in FIG. 2A, the whole surface of the upper electrode 105 is treated by a plasma of O$_2$ gas for 60 seconds.

Figure 2B:
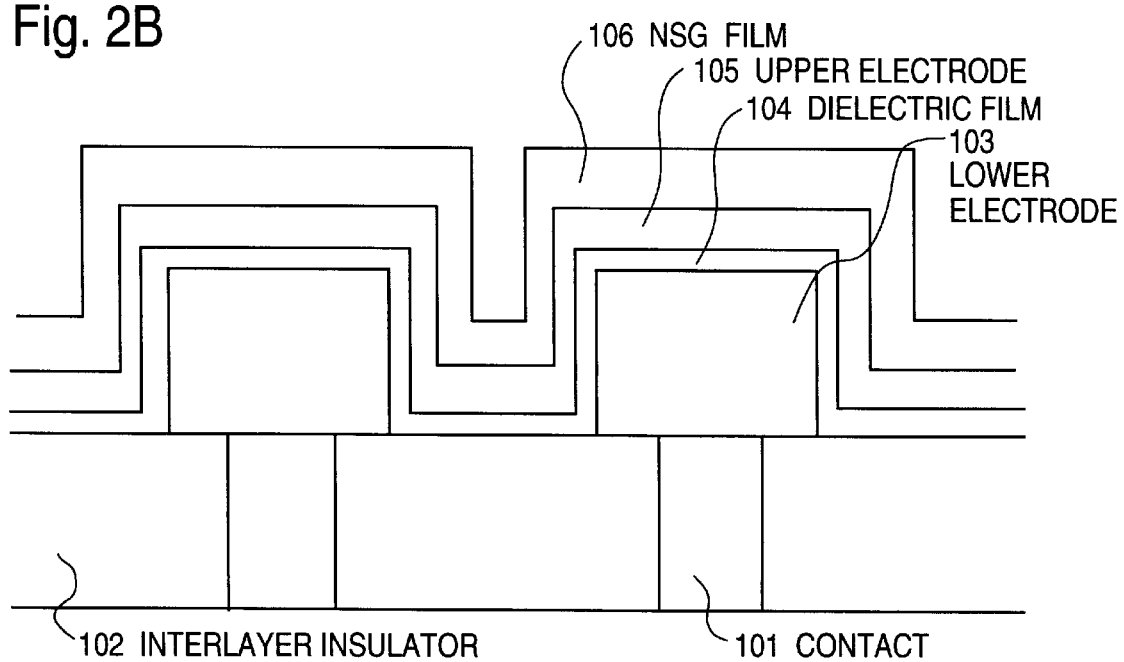

Then, as shown in FIG. 2B, as an interlayer insulator film, an NSG film 106 having a thickness of 800 nm is formed to cover the whole surface by a CVD process using the TEOS as the starting material. Thus, a stacked capacitor composed of the lower electrode 103, the high dielectric constant insulating film 104 and the upper electrode 105, is formed on the interlayer insulator film 102 in a semiconductor memory.

Figure 1B:
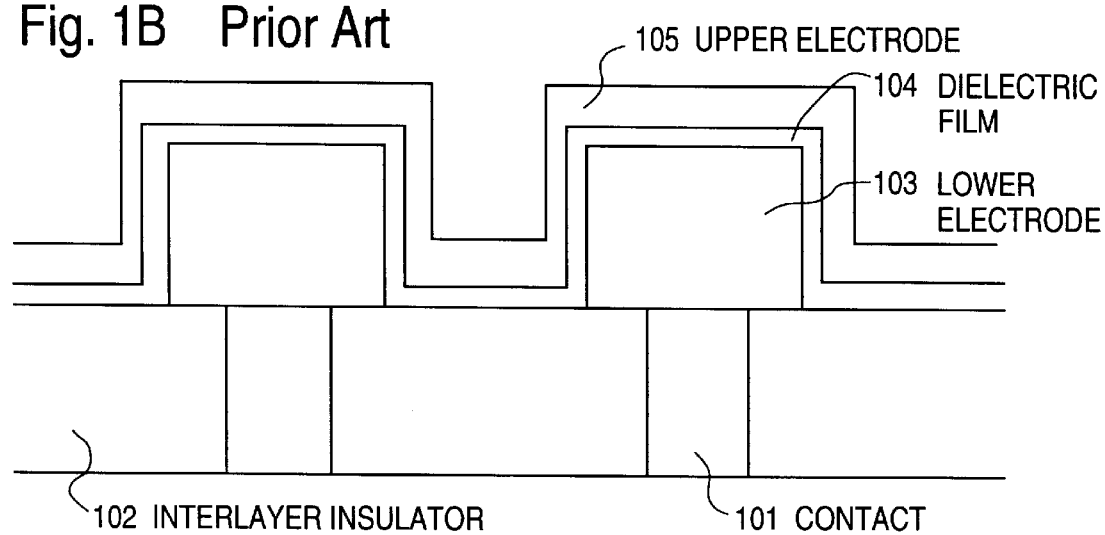
Figure 1C:
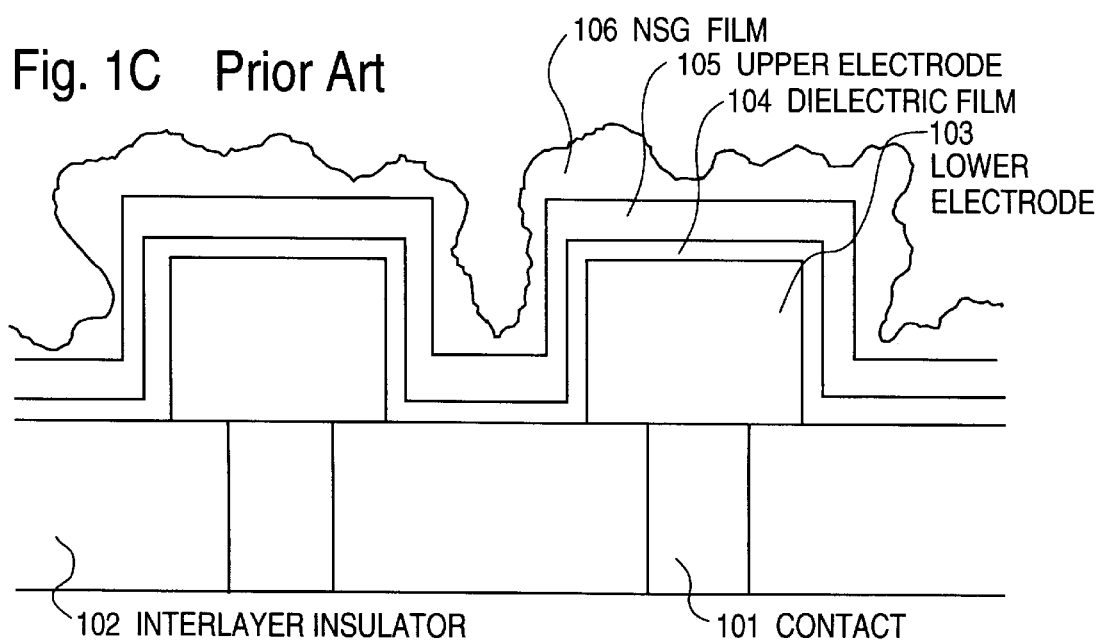

The following is the result of a sectional SEM (scanning electron microscope) observation of the NSG film formed in the above mentioned first embodiment and the NSG film formed in the prior art process as mentioned hereinbefore with reference to FIGS. 1A to 1C. The following data indicates an averaged value of the difference in height between a convex top and a concave bottom in the NSG film formed at a top surface and at a side surface of the stacked capacitor.

| Prior art process | 256 nm at top and 348 nm at side |
| First embodiment | 9.5 nm at top and 10.5 nm at side |

As could be seen from the above, the NSG film formed in the prior art process has a large concavo-convex having a height difference of about 300 nm to 500 nm at the top surface and at the side surface of the stacked capacitor. On the other hand, the NSG film formed in the first embodiment has only a small concavo-convex, and can be said to have a substantially uniform film thickness.

This advantage of the first embodiment can be considered to be obtained by treating the whole surface of the upper electrode by the O$_2$ plasma so that a suctorial layer is uniformly formed at the whole surface of the upper electrode before the NSG film is formed to over the upper electrode, and then by growing on the whole surface of the upper electrode the NSG film formed by using the TEOS as a starting material, with the result that the NSG film will be grown to have a uniform film thickness.

Second Embodiment

In the first embodiment, after the upper electrode is formed, the surface of the upper electrode is treated with the O$_2$ plasma. However, he surface of the upper electrode can be treated with another gas plasma, as will he described in connection with the following second embodiment.

First, similarly to the first embodiment, and as shown in FIG. 1A, a lower electrode 103 is formed by depositing a multilayer metal film formed of Ti, TiN and Ru on an interlayer insulator film 102 by a sputtering, and by patterning the multilayer metal film into a desired shape by a dry etching using a patterned photoresist mask so that the lower electrode 103 is formed at a position of a capacitor contact 101 formed to penetrate through the interlayer insulator film 102.

Then, similarly to the first embodiment, and as shown FIG. 1B, a high dielectric constant insulating film 104 of (Ba, Sr)TiO$_3$ is formed to cover the whole surface by the MO-CVD process, and an upper electrode 105 of Ru (ruthenium) is formed by on the high dielectric constant insulating film 104 by a sputtering.

Thereafter, as shown in FIG. 2A, the whole surface of the upper electrode 105 is treated by a plasma of a mixed gas of Ar/Cl$_2$ (90%/10% in volume) for 10 seconds.

Then, similarly to the first embodiment, and as shown in FIG. 2B, as an interlayer insulator film, an NSG film 106 having a thickness of 800 nm is formed to cover the whole surface by a CVD process using the TEOS as the starting material. Thus, a stacked capacitor composed of the lower electrode 103, the high dielectric constant insulating film 104 and the upper electrode 105, is formed on the interlayer insulator film 102 in a semiconductor memory.

The following is the result of a sectional SEM observation of the NSG film formed in the above mentioned second embodiment and the NSG film formed in the prior art process as mentioned hereinbefore with reference to FIGS. 1A to 1C. The following data indicates an averaged value of the difference in height between a convex top and a concave bottom in the NSG film formed at a top surface and at a side surface of the stacked capacitor.

| Prior art process | 256 nm at top and 348 nm at side |
| Second embodiment | 10.5 nm at top and 9.5 nm at side |

As could be seen from the above, the NSG film formed in the prior art process has a large concavo-convex having a height difference of about 300 nm to 500 nm at the top surface and at the side surface of the stacked capacitor. On the other hand, the NSG film formed in the second embodiment has only a small concavo-convex, and can be said to have substantially uniform film thickness.

This advantage of the second embodiment can be considered to be obtained by treating the whole surface of the upper electrode by the Ar/Cl$_2$ mixed gas plasma so that a suctorial layer is uniformly formed at the whole surface of the upper electrode before the NSG film is formed to over the upper electrode, and then by growing on the whole surface of the upper electrode the NSG film formed by a CVD process using the TEOS as a starting material, with the result that the NSG film will be grown to have a uniform film thickness.

In the above mentioned embodiments, the plasma treating time was on the order of 10 seconds to 60 seconds, but is in no way limited to these values. Namely, even if the plasma treating time was out of the time range of 10 seconds to 60 seconds, a similar advantage should have been obtained In this connection, however, considering a damage to the high dielectric constant insulating film given by the plasma (since electric charges of the plasma are accumulated in the insulating film, to cause dielectric breakdown in extreme cases) it is desired that the plasma treating time is as short as possible if a suctorial layer is successfully uniformly formed at the whole surface of the upper electrode layer. In the above mentioned embodiments in which the plasma treating time was on the order of 10 seconds to 60 seconds, the suctorial layer was successfully uniformly formed at the whole surface of the upper electrode layer with no damage to the high dielectric constant insulating film given by the plasma.

In addition, in the above mentioned embodiments, the upper electrode is formed of Ru (ruthenium), but can be formed of other noble metal such as Ir and Pt, or a noble metal oxide such $IrO_2$ and $RuO_2$. Moreover, in the above mentioned embodiments, the lower electrode is formed of a multilayer film of Ti, TiN and Ru laminated in the named order. However, the lower electrode can be effectively formed of a multilayer film of a first layer of Ru, a second layer of $RuO_2$ and a third layer laminated in the named order, the third layer including at least one material selected from the group consisting of Ru, Ir, Re, Os, Rh, their oxide, their silicide, or at least one material selected from the group consisting of Pt, Au, Ag, Pd, Ni and Co. Alternatively, the lower electrode can be effectively formed of a multilayer film of a first layer of TiN, a second layer of Ti and a third layer laminated in the named order, the third layer including at least one material selected from the group consisting of Ti. TiN, $TiSi_x$, Ta, TaN, W and WSi.

Furthermore, in the above mentioned embodiments, the high dielectric constant insulating film was formed of (Ba, Sr)$TiO_3$, but can be formed of a high dielectric constant oxide film expressed by the chemical formula $AB0_3$ where A is at least one selected from the (croup consisting of Ba, Sr, Pb, Ca, La, Li and K, and B is at least one selected from the group consisting of Ti, Zr, Ta, Nb, Mg, Fe, Zn and W. For example, the high dielectric constant insulating film can be formed of $SrTiO_3$, (Sr, Ca)$TiO_3$, (Ba, Sr, Ca)$TiO_3$, $PbTiO_3$, Pb(Zr, Ti)$O_3$, (Pb, La)(Zr, Ti)$O_3$, Pb(Mg, Nb)$O_3$, Pb(Mg, W)$O_3$, Pb(Zn, Nb)$O_3$, $LiTaO_3$, $LiNbO_3$, $KTaO_3$ and $KNbO_3$.

Alternatively, the high dielectric constant insulating film can be formed of a high dielectric constant oxide film expressed by the chemical formula $(Bi_2O_2)(A_{m-1}B_mO_{3m+1})$ where m=1, 2, 3, 4 or 5, A is at least one selected from the group consisting of Ba, Sr, Pb, Ca, K and Bi, and B is at least one selected from the group consisting of Nb, Ta, Ti and W.

For example, the high dielectric constant insulating film can be formed of $Bi_4Ti_3O_{12}$, $SrBi_2Ta_2O_9$ and $SrBi_2Nb_2O_9$.

Furthermore, the high dielectric constant insulating film can be formed of $Ta_2O_5$, which is different from the above mentioned two chemical formulas.

In the above mentioned embodiments, the high dielectric constant insulating film of (Ba, Sr)$TiO_3$ has a single-layer structure, but can have a two-layer structure that can be realized by changing a film deposition condition in the course of the (Ba, Sr)$TiO_3$ film deposition process. A similar advantage can be obtained even if the high dielectric constant insulating film is formed to have a multilayer structure that can be realized by changing a film deposition condition in the course of a film deposition process in such a manner that, of a plurality of layers, a lowermost layer has the highest dielectric constant.

As mentioned above, according to the present invention, since the surface of the upper electrode layer is treated with plasma, a suctorial layer is uniformly formed at the whole surface of the upper electrode layer, so that, by a CVD process using the TEOS as a starting material, the NSG film can be grown on the upper electrode layer to have a uniform film thickness.

In addition, even in a structure patterned to be difficult to control a crystallographic axis, since nucleuses are uniformly generated over the whole surface by the plasma treatment, an uniform film can be formed.

The invention has thus been shown and described with reference to the specific embodiments. However, it should be noted that the present invention is in no way limited to the details of the illustrated structures but changes and modifications may be made within the scope of the appended claims.

What is claimed is:

1. A method for forming a capacitor in the semiconductor memory, said method comprising:

forming a lower electrode having a desired pattern on an insulating film;

forming a high dielectric constant insulating film to cover the whole surface including said lower electrode;

forming an upper electrode layer to cover said high dielectric constant insulating film;

plasma treating a surface of said upper electrode layer so that said surface has some degree of roughness; and depositing a non-doped silicate glass film to cover said upper electrode layer by a CVD process using tetra-ethoxysilane as a starting material.

2. A method claimed in claim 1 wherein said plasma treatment is carried out by exposing a surface of said upper electrode layer to plasma of a gas comprising one of $O_2$ gas and a mixed gas of $Ar/Cl_2$ (90%/10% in volume).

3. A method claimed in claim 1 wherein said upper electrode is formed of a material comprising one of noble metal and noble metal oxide.

4. A method claimed in claim 3 wherein said lower electrode is formed of a multilayer film of a first layer of TiN, a second layer of Ti and a third layer laminated in the named order, said third layer comprising at least one of Ti, TiN, $TiSi_x$, Ta, TaN, W and WSi.

5. A method claimed in claim 3 wherein said lower electrode is formed of a multilayer film of a first layer of Ru, a second layer of $RuO_2$ and a third layer laminated in the named order, said third layer comprising at least one of Ru, Ir, Re, Os, Rh, their oxide, their silicide, or at least one of Pt, Au, Ag, Pd, Ni and Co.

6. A method claimed in claim 1 wherein said high dielectric constant insulating film comprises a high dielectric constant oxide film expressed by a chemical formula $ABO_3$, where A comprises at least one of Ba, Sr, Pb, Ca, La, Li and K, and B comprises at least one of Ti, Zr, Ta, Nb, Mg, Fe, Zn and W.

7. A method claimed in claim 1 wherein said high dielectric constant insulating film comprises a high dielectric constant oxide film comprising one of $SrTiO_3$, (Sr, Ca)$TiO_3$, (Ba, Sr, Ca)$TiO_3$, $PbTiO_3$, Pb(Zr, Ti)$O_3$, (Pb, La)(Zr, Ti)$O_3$, Pb(Mg, Nb)$O_3$, Pb(Mg, W)$O_3$, Pb(Zn, Nb)$O_3$, $LiTaO_3$, $LiNbO_3$, $KTaO_3$ and $KNbO_3$.

8. A method claimed in claim 1 wherein said high dielectric constant insulating film comprises a high dielectric constant oxide film expressed by the chemical formula $(Bi_2O_2)(A_{m-1}B_m)_{3m+1})$ where m=1, 2, 3, 4 or 5, A comprises at least one of Ba, Sr, Pb, Ca, K and Bi, and B comprises at least one of Nb, Ta, Ti and W.

9. A method claimed in claim 1 wherein said high dielectric constant insulating film comprises a high dielectric constant oxide film comprising one of $Bi_4Ti_3O_{12}$, $SrBi_2Ta_2O_9$ and $SrBi_2Nb_2O_9$.

10. A method claimed in claim 1 wherein said high dielectric constant insulating film comprises $Ta_2O_5$.

11. A method claimed in claim 1 wherein said plasma treating causes defects from which a crystal grows to be uniformly generated over said surface of said upper electrode.

12. A method claimed in claim 1 wherein said plasma treating comprises treating a surface of said upper electrode with a plasma of $O_2$ gas for 60 seconds.

13. A method claimed in claim 1 wherein said plasma treating comprises treating a surface of said upper electrode with a plasma of a mixed gas of $Ar/Cl_2$ (90%/10% by volume) for 10 seconds.

14. A method claimed in claim 1 wherein said non-doped silicate glass film has a uniform film thickness.

15. A method claimed in claim 1 wherein said plasma treating is conducted for a period in a range of about 10 second to 60 seconds.

16. A method claimed in claim 1 wherein said capacitor comprises a stacked capacitor, wherein said non-doped silicate glass film has a thickness of 800 nm and wherein an average value of a difference in height between a convex top and a concave bottom in said non-doped silicate glass film formed at a top surface of said stacked capacitor is about 10.5 nm and a height difference between a convex top and a concave bottom in said non-doped silicate glass film formed at a side surface of said stacked capacitor is about 9.5 nm.

* * * * *